US008396823B2

(12) United States Patent
Akatsu et al.

(10) Patent No.: US 8,396,823 B2
(45) Date of Patent: Mar. 12, 2013

(54) AUTOMATIC DESIGNING SYSTEM, AUTOMATIC DESIGNING METHOD AND AUTOMATIC DESIGNING PROGRAM FOR AUTOMATICALLY DESIGNING ARCHITECTURE FOR SYSTEM COMPONENTS

(75) Inventors: Hiroyuki Akatsu, Tokyo (JP); Hisashi Miyashita, Kanagawa-ken (JP); Hiroaki Nakamura, Kanagawa-ken (JP); Takashi Nerome, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 436 days.

(21) Appl. No.: 12/825,830

(22) Filed: Jun. 29, 2010

(65) Prior Publication Data
US 2010/0332444 A1  Dec. 30, 2010

(51) Int. Cl.
*G06F 17/00* (2006.01)
(52) U.S. Cl. .......................................... 706/54; 707/798
(58) Field of Classification Search ..................... 706/54
See application file for complete search history.

(56) References Cited

U.S. PATENT DOCUMENTS

| | | | | |
|---|---|---|---|---|
| 5,946,679 | A * | 8/1999 | Ahuja et al. | 1/1 |
| 7,287,033 | B2 * | 10/2007 | Shadmon et al. | 1/1 |
| 2009/0182549 | A1 * | 7/2009 | Anisimovich et al. | 704/4 |
| 2010/0306818 | A1 * | 12/2010 | Li et al. | 726/1 |

FOREIGN PATENT DOCUMENTS
JP    2006-343858    12/2006

OTHER PUBLICATIONS

K. Czarnecki, M. Antkiewicz, MappingFeatures to Models: ATemplate Approach Based on Superimposed Variants, GenerativeProgramming and ComponentEngineering,2005.
P. Jayaraman, et al., ModelComposition in Product Lines and Feature Interaction Detection Using CriticalPair Analysis, Model Driven Engineering Languages and Systems, 2007.

* cited by examiner

*Primary Examiner* — Jeffrey A Gaffin
*Assistant Examiner* — David H Kim
(74) *Attorney, Agent, or Firm* — Vazken Alexanian

(57) ABSTRACT

An automatic designing system includes: a rule storage unit storing sets of rewrite rules for rewriting variable nodes of a hierarchically structured graph in a design architecture for the system; a search unit sequentially determining variable nodes as application targets for the rewrite rules by searching the graph, including components in the design architecture for the system to be designed, using a search tree; a judgment unit judging whether the rewrite rule is applicable to the determined variable node; and a rule application unit replacing the determined variable node with a partial graph, including at least one of fixed and variable nodes, according to the rewrite rule, in response to a judgment that the rewrite rule is applicable. The search unit performs the searching until an undefined variable node no longer exists in the graph to be designed, and performs backtracking on condition that no variable node is found.

12 Claims, 18 Drawing Sheets

(a)  L → R
(b)  ECU1  ~ 400
/Doorlock/ECU2  ~ 402
/Doorlock/ECU2 [/Doorloc/ECU1~G]  ~ 404
(c)  ECU1 → 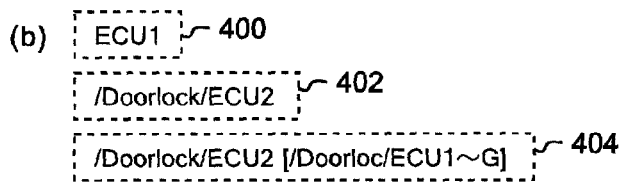
(d)  /Doorlock/ECU2 [/Doorloc/ECU1~ 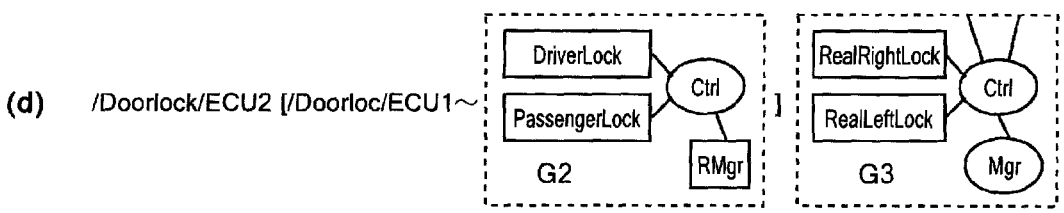 ]
FIG. 4

(a)

| GRAPH NAME | NODE NAME | NODE TYPE (VARIABLE NODE/FIXED NODE) | REPLACEABLE GRAPH NAME |
|---|---|---|---|
| G1 | DoorLock | VARIABLE NODE | G2 |
| G2 | ECU1 | VARIABLE NODE | G3 |
| G2 | ECU2 | VARIABLE NODE | UNDEFINED |
| G3 | DriverLock | VARIABLE NODE | UNDEFINED |
| G3 | PassengerLock | VARIABLE NODE | UNDEFINED |
| G3 | Controller | FIXED NODE | — |
| G3 | RCtrl | FIXED NODE | — |

(b)

| GRAPH NAME | EDGE NAME | NAME OF ONE END NODE | NAME OF OTHER END NODE |
|---|---|---|---|
| G2 | (e1) | ECU1 | ECU2 |
| G2 | (e2) | ECU1 | ECU2 |
| G3 | (e1) | DriverLock | Controller |
| G3 | (e2) | PassengerLock | Controller |
| G3 | (e3) | Controller | RCtrl |
| G3 | (e4) | RCtrl | (n1) |
| G3 | (e5) | RCtrl | (n2) |

| GRAPH NAME | NODE NAME | NODE TYPE (VARIABLE NODE/FIXED NODE) | REPLACEABLE GRAPH NAME |
|---|---|---|---|
| G5 | DriverLock | VARIABLE NODE | UNDEFINED |
| G5 | PassengerLock | VARIABLE NODE | UNDEFINED |
| G5 | Ctrl | FIXED NODE | — |
| G5 | RMgr | VARIABLE NODE | UNDEFINED |

(b)

| GRAPH NAME | EDGE NAME | NAME OF ONE END NODE | NAME OF OTHER END NODE |
|---|---|---|---|
| G5 | e1' | DriverLock | Ctrl |
| G5 | e2' | PassengerLock | Ctrl |
| G5 | e3' | Ctrl | RMgr |
| G5 | e4' | Ctrl | (n1) |
| G5 | e5' | RMgr | (n2) |

FIG. 9

(a)
```
DoorLock
```
(b)
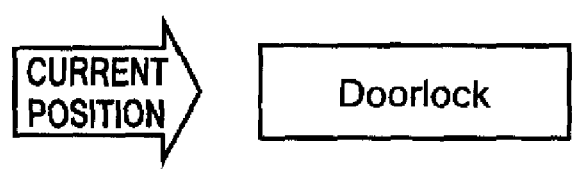
(c)
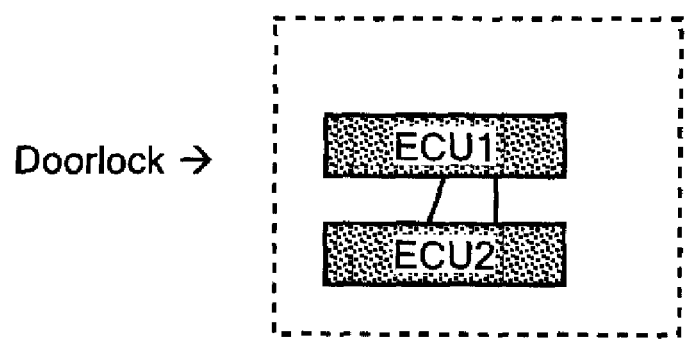
FIG. 10

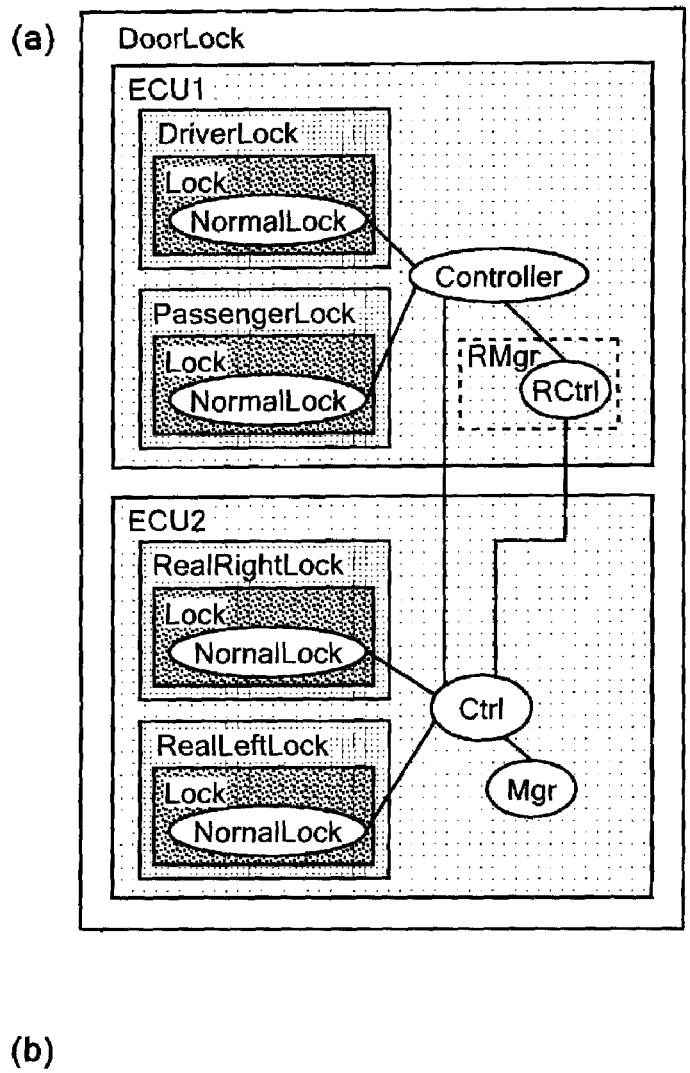
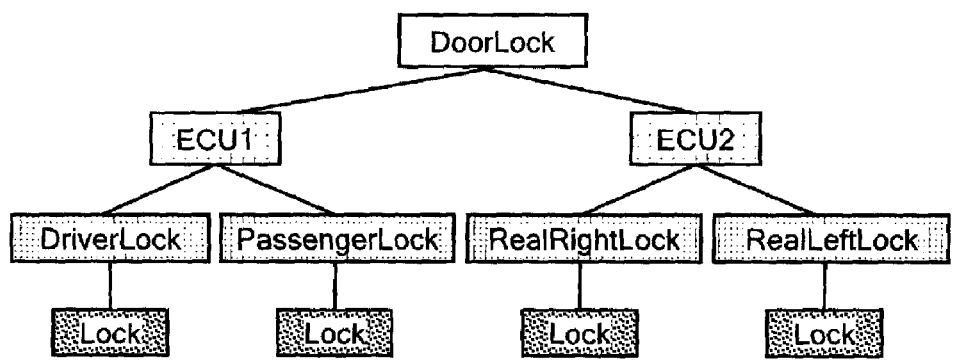
FIG. 16

AUTOMATIC DESIGNING SYSTEM, AUTOMATIC DESIGNING METHOD AND AUTOMATIC DESIGNING PROGRAM FOR AUTOMATICALLY DESIGNING ARCHITECTURE FOR SYSTEM COMPONENTS

CROSS REFERENCE TO RELATED APPLICATION

This application claims priority under 35 U.S.C. 119 from Japanese Patent Application 2009-155101, filed Jun. 30, 2009, the entire contents of which are incorporated herein by reference.

BACKGROUND OF THE INVENTION

1. Field of the Invention

The present invention relates to a technique of reusing a system design architecture represented by a hierarchical structure and thereby automatically generating a new architecture for system components by computer processing.

2. Description of Related Art

In the manufacturing industries such as electronics and automotive industries, there is an urgent need to improve productivity in derivative product development by reuse of developed assets.

Japanese Patent JP-A 2006-343858 discloses one conventional technique of reusing developed assets. The patent discloses the technique of creating a system model by combining models of multiple parts. Specifically, storage devices are provided for storing parameters, tools, and model templates of multiple parts constituting a system, which are used to create a system model. Models of the parts are created by reading the model templates of the parts and the parameters from the storage devices, and assigning the model templates the parameters, in accordance with an instruction inputted by a user. Then the tools are read and run to combine the models of the parts.

K. Czarnecki, and M. Antkiewicz, "Mapping Features to Models: A Template Approach Based on Superimposed Variants," Generative Programming and Component Engineering, 2005, provides another example of a conventional technique of reusing developed assets. The publication discloses the technique of generating a derivative model by allowing a user to previously describe variable model fragments in annotations superimposed on a base model, allowing the user to select a desired model fragment among the variable model fragments thus described and superimposed, and combining the selected model fragment and the base model.

P. Jayaraman, J. Whittle, A. Elkhodary and H. Gomaa, "Model Composition in Product Lines and Feature Interaction Detection Using Critical Pair Analysis," Model Driven Engineering Languages and Systems, 2007, provides still another conventional technique of reusing developed assets. This publication discloses the technique of generating a derived model by: previously preparing graph rewrite rules indicating variable parts of a base model; and rewriting the base model by using a selected rewrite rule.

Although the technique of Patent JP-A 2006-343858 allows the partial use of computation by a computer, selection on how existing architectures are combined is left to a human. The technique also requires a human to check if the model obtained by the combination meets requirements imposed on the system. Such features prevent more efficient reuse of design architectures.

The techniques of the two publications referred to above allow the use of computation by a computer. However, since the technique of K. Czarneckin and M. Antkiewicz, "Mapping Features to Models: A Template Approach Based on Superimposed Variants," Generative Programming and Component Engineering, 2005, expresses a model in a graph superimposed by all variable points, the model is harder to read and more difficult to make an addition or change to when the model has a larger number of variable points. This prevents efficient reuse of large-scale design architectures.

Meanwhile, the technique of P. Jayaraman, J. Whittle and A. Elkhodary, H. Gomaa, "Model Composition in Product Lines and Feature Interaction Detection Using Critical Pair Analysis," Model Driven Engineering Languages and Systems, 2007, limits application targets to which the rewrite rules are applied, to concrete components of a graph (vertices and their attributes, and edges and their attributes, the vertices and edges being described as fixed points whose design has been defined). If such a limitation is eased so that vertices, which are described as variable points whose design has not been defined, can be included in the application targets, other complications arise with respect to writing rewrite rules, increasing time and complexity.

SUMMARY OF THE INVENTION

The present invention provides a method and apparatus which enables efficient reuse of design architectures by means of computation by a computer. The present invention also provides a method of deriving architectures by using graph rewrite rules targeting variable points whose design has not been defined, as well as fixed points, and to provide a method capable of simplifying the way of writing rewrite rules and reducing time complexity.

According to one aspect of the present invention an automatic designing system for automatically designing an architecture for components in a system, includes: a rule storage unit which stores a set of rewrite rules each used for rewriting a variable node of a hierarchically structured graph in a design architecture for the system, a rewritable part of the rewrite rules being taken as a variable node and a non-rewritable part being taken as a fixed node in a previously-designed design architecture for the system; a search unit which sequentially determines variable nodes to be application targets for the rewrite rules, by repeatedly searching the graph including components in the design architecture for the system to be designed, by use of a search tree for the graph, until an undefined variable node no longer exists in the graph, and which performs backtracking on condition that no variable node to be the application target is found; a judgment unit which reads one of the rewrite rules corresponding to the determined variable node from the rule storage unit, and judges whether or not the rewrite rule is applicable to the determined variable node; and a rule application unit which replaces the determined variable node with a partial graph in accordance with the read rewrite rule in response to a judgment result that the read rewrite rule is applicable, the partial graph including at least one of the fixed node and the variable node.

In accordance with another aspect of the present invention, a computer-implemented automatic design method is used for automatically designing an architecture for components in a system. The method operates in a computer capable of accessing a storage unit which stores a set of rewrite rules each used for rewriting a variable node of a hierarchically structured graph in a design architecture for the system, the rewrite rules being written while a rewritable part is taken as a variable node and a non-rewritable part is taken as a fixed node in a previously-designed design architecture for the system. The automatic designing method includes the steps of: (a) storing, in a work area, a graph for components in the design architecture for the system to be designed; (b) searching the graph, including the components to be designed, by means of computation by the computer using a search tree corresponding to the graph, thereby determining a variable node to be an application target for any of the rewrite rules, and then storing, as a current search position, a position of a node in the search tree corresponding to the determined variable node; (c) reading one of the rewrite rules from the storage unit, and judging, by means of computation by the computer, whether or not the read rewrite rule is applicable to the determined variable node; (d) in response to a judgment result that the read rewrite rule is applicable, replacing the determined variable node with a partial graph, which includes at least one of the fixed node and the variable node, in accordance with the read rewrite rule by means of computation by the computer, and storing, in the work area, the resultant graph for the components to be designed; and (e) repeating steps (b) to (d) while updating the current search position, until an undefined variable node no longer exists in the graph for the components to be designed. If no variable node to be the application target is found in the searching step, backtracking is performed and thus the current search position is moved back to the previous one.

BRIEF DESCRIPTION OF THE DRAWINGS

For a more complete understanding of the present invention and the advantage thereof, reference is now made to the following description taken in conjunction with the accompanying drawings.

FIG. 4A shows an example of the way of writing a rewrite rule. FIG. 4B shows an example of a left-hand side of a rewrite rule. FIG. 4C shows an example of a rewrite rule. FIG. 4D shows an example of a rewrite rule with a conditional expression.

FIG. 7A shows an example of a node table managed in a computer as a part of the graph shown in FIG. 6A. FIG. 7B shows an example of an edge table managed in the computer as another part of the graph shown in FIG. 6A.

FIG. 9A shows an example of a node table for a rewrite rule 802. FIG. 9B shows an example of an edge table for the rewrite rule 802.

FIG. 10A shows an example of a graph to be designed at the start of a rewriting operation. FIG. 10B shows an example of a search tree corresponding to the graph shown in FIG. 10A. FIG. 10C shows a rewrite rule applicable to a variable node indicated by a current position arrow shown in FIG. 10B.

FIG. 16A shows a graph obtained by applying the multiple rewrite rules shown in FIGS. 5C and 5D to the graph shown in FIG. 15A. FIG. 16B shows an example of a search tree corresponding to the graph shown in FIG. 16A.

DETAILED DESCRIPTION OF THE PREFERRED EMBODIMENTS

Figure 1:
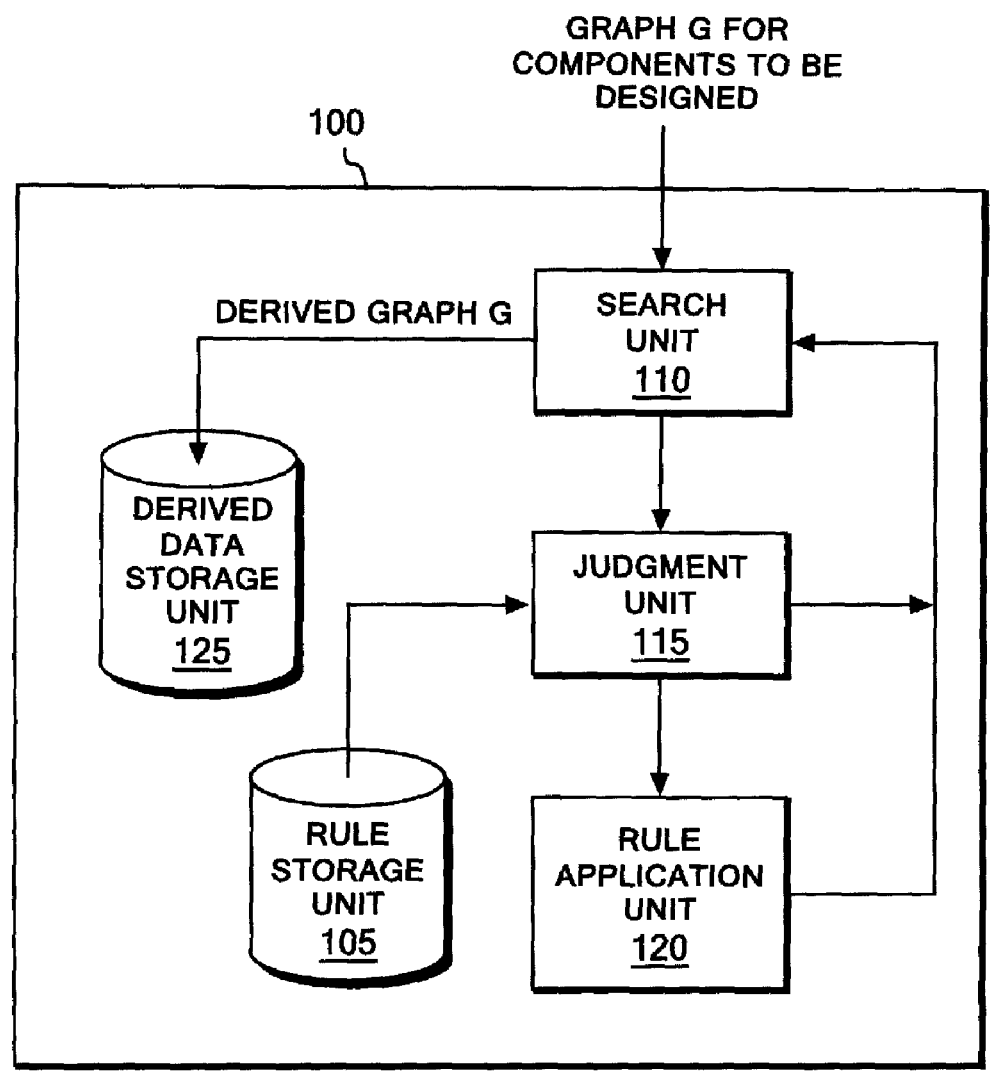
FIG. 1 shows an example of a functional configuration of an automatic designing system 100 according to an embodiment of the present invention.

The present invention is implemented by an automatic designing system for automatically designing an architecture for components in a system. The automatic designing system includes a rule storage unit which stores a set of rewrite rules each used for rewriting a variable node of a hierarchically structured graph in a design architecture for the system, the rewrite rules being written while a rewritable part is taken as a variable node and a non-rewritable part is taken as a fixed node in a previously-designed design architecture for the system.

A search unit sequentially determines variable nodes to be application targets for the rewrite rules by repeatedly searching the graph, including components in the design architecture for the system to be designed, by use of a search tree for the graph, until an undefined variable node no longer exists in the graph. The search unit performs backtracking on condition that no variable node to be the application target is found.

A judgment unit reads one of the rewrite rules corresponding to the determined variable node from the rule storage unit, and judges whether or not the rewrite rule is applicable to the determined variable node. A rule application unit replaces the determined variable node with a partial graph in accordance with the read rewrite rule in response to a judgment result that the read rewrite rule is applicable, the partial graph including at least one of the fixed node and the variable node.

It should be noted here that the rewrite rules, which are written while a rewritable part is taken as a variable node and a non-rewritable part is taken as a fixed node in the previously-designed design architecture for the system, may be created by manual setting, or by a combination of manual setting and computation by a computer.

Preferably, the search unit searches the graph including the components to be designed, by using the search tree in a depth-first order, and in a left-first order for nodes at the same depth.

Preferably, each of the rewrite rules stored in the rule storage unit includes rewrite-source identification information for identifying a rewrite-source variable node. In addition, the judgment unit reads, from the rule storage unit, at least one of the rewrite rules, which includes the rewrite-source identification information for identifying the determined variable node.

Preferably, the rewrite-source identification information included in each of the rewrite rules uses Xpath to indicate the rewrite-source variable node. In addition, the judgment unit reads, from the rule storage unit, at least one of the rewrite rules, which includes the rewrite-source identification information for indicating a node located in the corresponding search tree and corresponding to the determined variable node.

Preferably, each of the rewrite rules stored in the rule storage unit includes rewrite-source identification information for identifying a rewrite-source variable node. In addition, the rule application unit gives, to each rewrite rule once used, a used mark including identification information of a variable node to which the rewrite rule is applied. Additionally, the judgment unit reads, from the rule storage unit, at least one of the rewrite rules which includes the rewrite-source identification information for identifying the determined variable node, and which is given no used mark including the identification information of the determined variable node.

Preferably, each of the rewrite rules stored in the rule storage unit further includes partial graph information indicating the partial graph with which the variable node being a rewrite source should be replaced and which includes at least one of the fixed node and the variable node. In addition, the rule application unit rewrites the determined variable node in accordance with the partial graph information.

Preferably, each of the rewrite rules stored in the rule storage unit includes an application condition indicating a condition for applying the rewrite rule. In addition, the judgment unit judges that the read rewrite rule is applicable on condition that the application condition is satisfied.

Preferably, the application condition included in each of the rewrite rules includes judgment target identification information for identifying a variable node to be judged as to whether the applied condition is satisfied, and a partial graph condition indicating a certain partial graph including at least one of the fixed node and the variable node. In addition, the judgment unit identifies the variable node in the graph for the components to be designed, with reference to the judgment target identification information, and judges that the read rewrite rule is applicable on condition that the partial graph with which the identified variable node is replaced and the certain partial graph indicated by the partial graph condition match each other.

Preferably, the search tree has, as its nodes, all variable nodes included in the graph for the components to be designed, and has a tree structure corresponding to the hierarchical structure of the graph for the components to be designed.

Preferably, the rule application unit updates the search tree in response to the replacement of the determined variable node.

The present invention is described above as an automatic designing system for automatically designing an architecture for components in a system. However, the present invention may also be understood as an automatic designing method for automatically designing an architecture for components in a system by means of computation by a computer; or an automatic designing program for automatically designing an architecture for components in a system, the automatic designing program being executed by a computer.

The best mode contemplated for implementing the present invention is described in detail below on the basis of the drawings. It should be noted, however, that the embodiment described below does not limit the present invention according to the scope of claims, and that not all combinations of features described in the embodiment are necessarily essential as solving means of the present invention. Further, the same elements are denoted by the same reference numerals throughout the description of the embodiment.

FIG. 1 is a diagram showing an example of a functional configuration of an automatic designing system 100 for automatically designing an architecture for system components, according to the embodiment of the present invention. The automatic designing system 100 according to the embodiment of the present invention includes a rule storage unit 105, a search unit 110, a judgment unit 115, a rule application unit 120 and a derived data storage unit 125.

The rule storage unit 105 stores sets of rewrite rules used for rewriting variable parts of graphs in a system design architecture represented by a hierarchical structure. The rewrite rules according to the embodiment are written while a rewritable part is taken as a variable node and a non-rewritable part is taken as a fixed node in a system design architecture previously designed and represented by a hierarchical structure.

Figure 2:
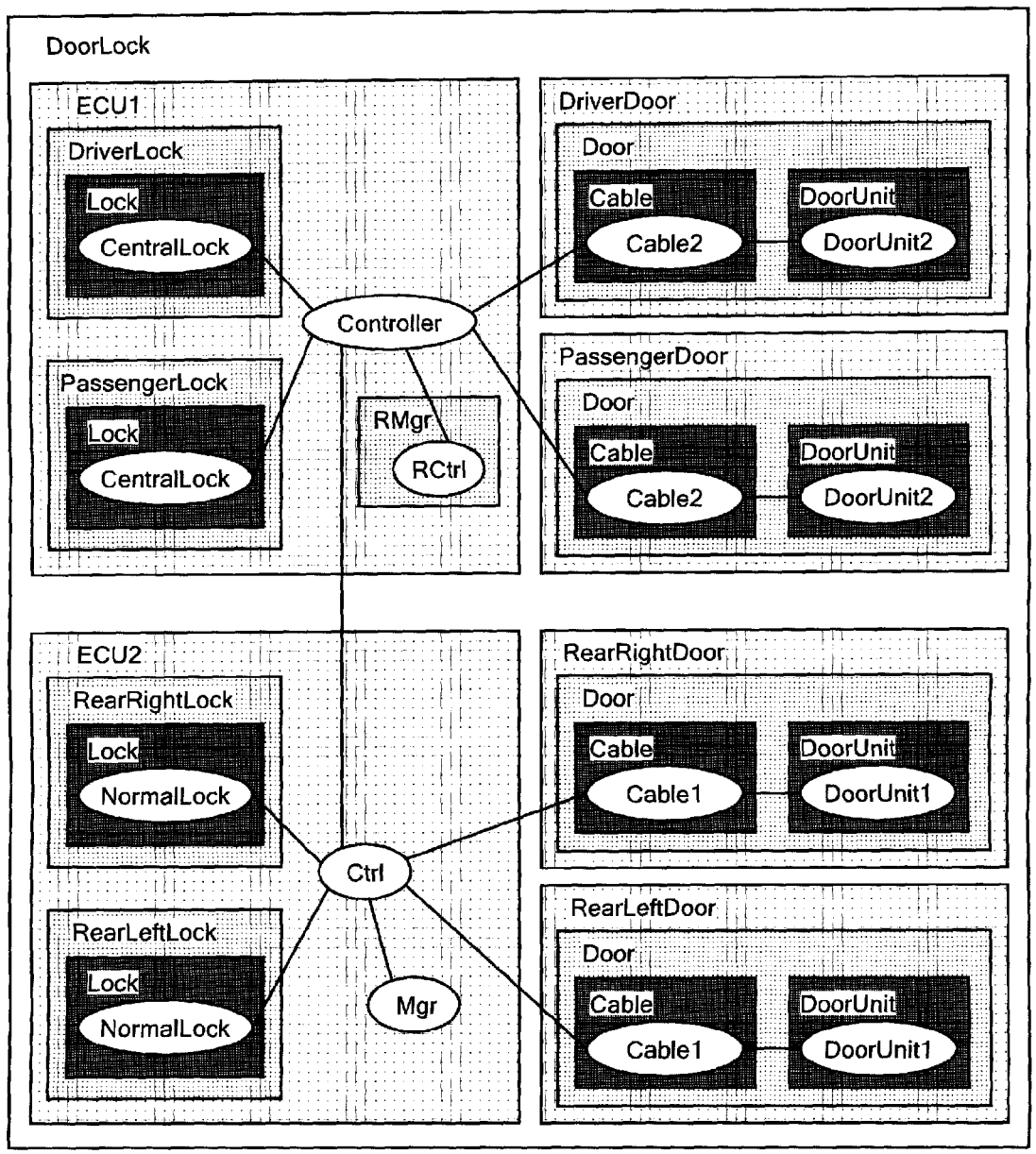
FIG. 2 shows an example of a graph in an architecture designed for a vehicle door locking mechanism.

The rewrite rules according to the embodiment will now be described with reference to FIGS. 2 to 5. FIG. 2 is a diagram showing an example of a graph in an architecture for a vehicle door locking mechanism. In general, a system design architecture can be expressed by a hierarchical structure. Layers of the hierarchical structure can be based on various points of view, including layers based on work distribution, and layers based on subdivision of a task such as planning, request, designing or implementation, for example. In view of the above, the present invention expresses a system design architecture, which is represented by a hierarchical structure, through hierarchized graphs in the system design architecture, by taking a rewritable part as a variable node and taking a non-rewritable part as a fixed node in the design architecture.

FIG. 2 illustrates a system design architecture which is stratified in terms of work distribution, as hierarchized graphs in the system design architecture, by taking a rewritable part as a variable node and taking a non-rewritable part as a fixed node. Note that, in FIG. 2, a rectangle indicates a variable node whereas an ellipse indicates a fixed node. As can be understood from FIG. 2, an inner rectangle indicates a more concrete design architecture, and an inclusion relation between rectangles or between a rectangle and an ellipse represents a rule in which an upper variable node is replaced with a lower variable node or fixed node which has the inclusion relation with the upper variable node, the variable nodes being each indicated by a rectangle and the fixed node being indicated by an ellipse.

Figure 3:
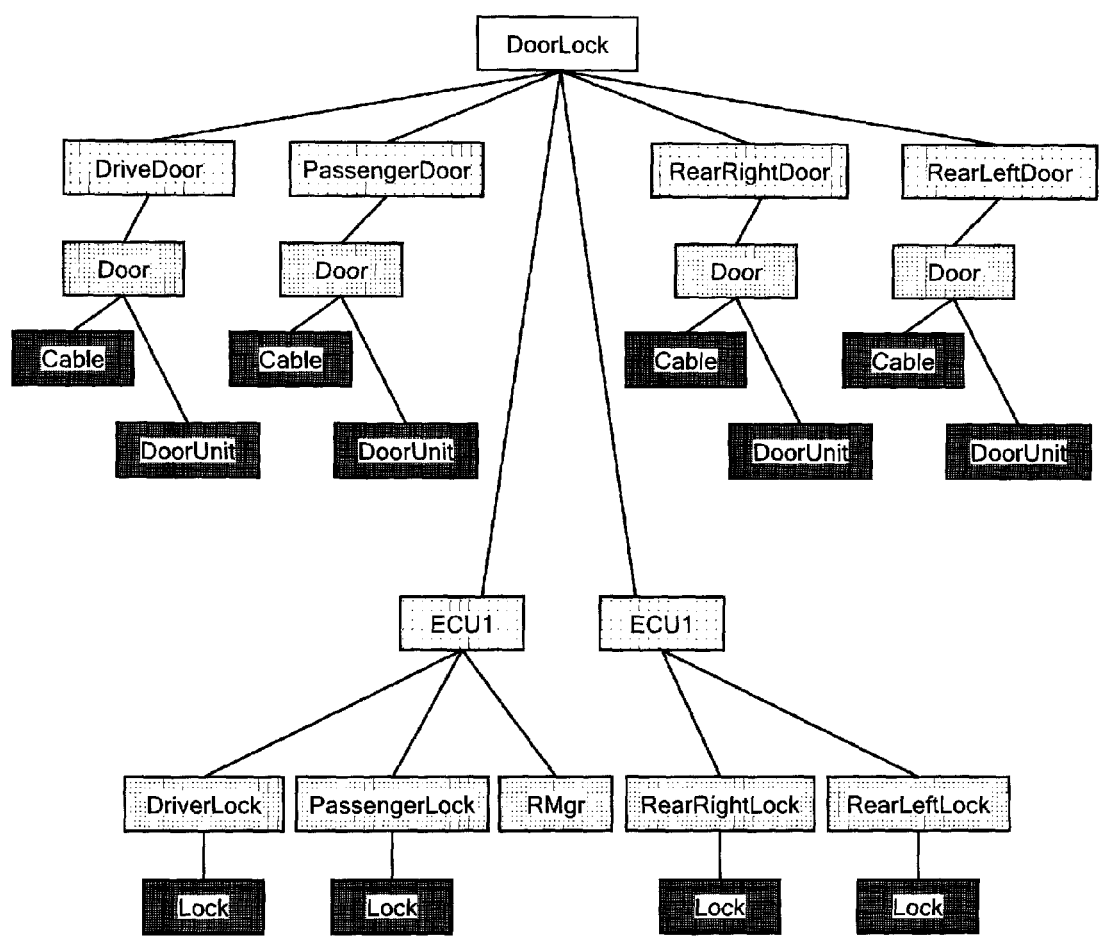
FIG. 3 shows a tree representing the hierarchical structure of the graph in the design architecture shown in FIG. 2.
Figure 5:
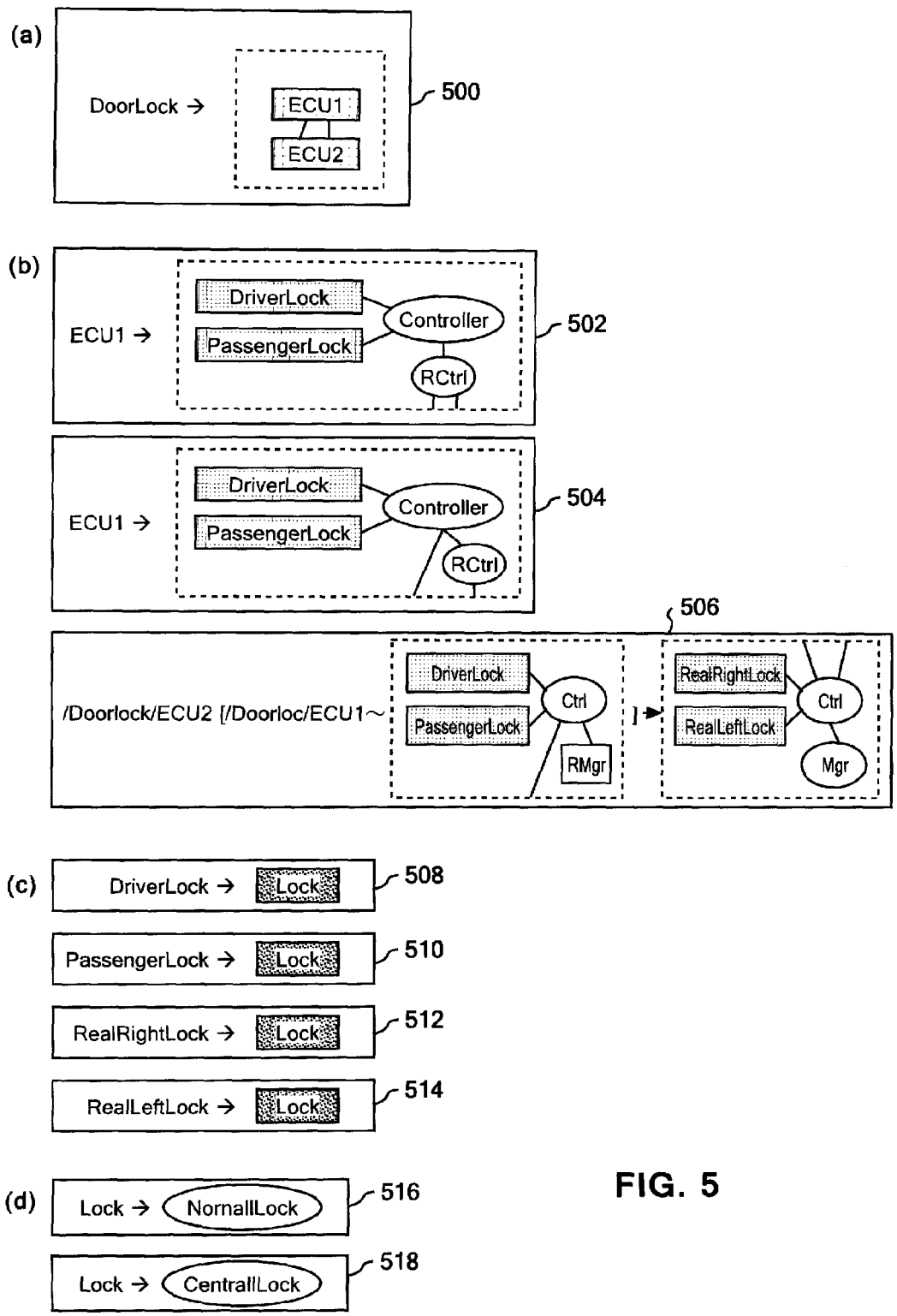
FIG. 5A shows an example of a rewrite rule stored in a rule storage unit 105 of the embodiment.
FIG. 5B shows another example of the rewrite rule stored in the rule storage unit 105 of the embodiment.
FIG. 5C shows still another example of the rewrite rule stored in the rule storage unit 105 of the embodiment.
FIG. 5D shows yet another example of the rewrite rule stored in the rule storage unit 105 of the embodiment.

FIG. 3 shows a tree representing the hierarchical structure of the graph shown in FIG. 2. Note, however, that the fixed nodes are omitted in FIG. 2 for the sake of brevity. The tree in FIG. 3 more clearly shows the relation between the upper and lower nodes of the graph shown in FIG. 2. Let us now focus on the inclusion relation between a variable node ECU1 and variable nodes DriverLock, PassengerLock and RMgr under the variable node ECU1, for example. The inclusion relation shows that a rewrite rule can be created in which the variable node ECU1 is replaced with the three variable nodes Driver-Lock, PassengerLock and RMgr. In this manner, in the present invention of the present application, design architecture patterns are described as graph rewrite rules on the basis of multiple system design architectures previously designed and represented by a hierarchical structure, by taking a rewritable part as a variable node and taking a non-rewritable part as a fixed node.

Specifically, rewrite rules stored in the rule storage unit 105 according to the embodiment each include rewrite-source identification information for identifying a rewrite-source variable node. Preferably, the rewrite-source identification information indicates the rewrite-source variable node with an XPath expression. In addition, each rewrite rule includes partial graph information indicating a partial graph with which the rewrite-source variable node should be replaced and which includes at least one of a fixed node and a variable node.

Moreover, the rewrite rule may include an application condition indicating a condition for applying the rewrite rule. Preferably, the application condition includes: judgment target identification information for identifying a variable node to be judged as to whether the application condition is satisfied; and a partial graph condition indicating a certain partial graph including at least one of a fixed node and a variable node. The rewrite rule with the application condition is requested to be applied to the rewrite-source variable node on condition that the variable node which is the judgment target matches the certain partial graph indicated by the partial graph condition. FIGS. 4A to 4D show an example of the way of writing rewrite rules described in the above-described manner.

FIG. 4A shows an example of the way of writing a rewrite rule. In FIG. 4A, a left-hand side L indicates rewrite-source identification information, and a right-hand side R indicates a partial graph with which the rewrite-source variable node can be replaced. An arrow located between L and R indicates that the left-hand side L can be replaced with the right-hand side R. FIG. 4B shows an example of rewrite-source identification information which indicates a rewrite-source variable node with an XPath expression. Rewrite-source identification information 400 indicates the variable node ECU1, which is a rewrite source, by a relative path from a current position.

Rewrite-source identification information 402 indicates a variable node ECU2, which is a rewrite source, by an absolute path from a root DoorLock. Rewrite-source identification information 404 is rewrite-source identification information with an application condition, which shows a condition for applying a rewrite rule in a predicate between brackets. To be more specific, the rewrite-source identification information 404 indicates, by an absolute path from the root DoorLock, the variable node ECU2, which is a rewrite source and requires an application condition that the variable node ECU1 under the root DoorLock matches a graph pattern G1.

FIGS. 4C and 4D show examples of a rewrite rule according to the embodiment. The rewrite rule shown in FIG. 4C indicates that the variable node ECU1, which can be tracked directly from the current position, is replaced with the graph G1. The rewrite rule shown in FIG. 4D indicates that the variable node ECU2, which can be tracked from the uppermost variable node DoorLock, is replaced with a graph G3 on condition that the variable node ECU1, which can be tracked from the uppermost variable node DoorLock, matches a graph G2.

FIGS. 5A to 5D show an example of sets of rewrite rules stored in the rule storage unit 105. The sets of rewrite rules shown in FIGS. 5A to 5D are created on the basis of multiple graphs in a system architecture previously designed. Note that, the rewrite rules shown in FIGS. 5A to 5D are based respectively on inclusion relations between layers whose combination is different from one relation to another. In this way, variability of graphs is described on a per rewrite-rule basis in the present invention. This avoids the problem of the deterioration in readability due to the increase in the number of variable points, and also allows easy addition or change on a per rewrite-rule basis, unlike Non-patent Literature 1.

The search unit 110 sequentially determines variable nodes, to which rewrite rules should be applied, by repeatedly searching graphs for components in a system design architecture to be designed, by use of search trees for the respective graphs, until an undefined variable node no longer exists in the graphs for components to be designed. Here, the graphs for components to be designed can be provided to the automatic designing system 100 through an input device such as a keyboard or a mouse, a recording media reader or a communication interface.

Moreover, each search tree has, as its nodes, all variable nodes included in the corresponding graph for components to be designed, and has a tree structure corresponding to the hierarchical structure of the graph for components to be designed. Preferably, the search unit 110 searches a graph for components to be designed, by use of the search tree for the graph, in a depth-first order and in a left-first order for nodes at the same depth.

If no variable node to which rewrite rules should be applied is found, the search unit 110 performs backtracking to cancel the graph rewriting previously done and thus move the search position back to the previous one. If backtracking cannot be performed, that is, if there is no previously-done graph rewriting to be cancelled, architecture derivation fails. On the other hand, if an undefined variable node no longer exists in the graph for components to be designed, architecture derivation succeeds.

In graph rewriting, in general, the order of applying rewrite rules to a graph for components to be designed directly affects the amount of calculation. In consideration of this background, the present invention applies rewrite rules to the graph in the order according to a tree structure of the graph representing a hierarchical structure, in order to reduce the time complexity. Searching a graph in the order according to the tree structure makes it possible to limit the space to be searched, and thus to determine the order in which rewrite rules are applied to a graph, with a practical amount of calculation. It should be noted here that adoption of such an order of applying rewrite rules enables the way of writing rewrite rules in the above-described manner, that is, a very simple way of writing rewrite rules indicating a rewrite-source variable node and a partial graph with which the variable node should be replaced.

The judgment unit 115 reads, from the rule storage unit 105, a rewrite rule for the variable node determined by the search unit 110, and judges whether or not the rewrite rule is applicable. Specifically, the judgment unit 115 reads, from the rule storage unit 105, at least one rewrite rule including rewrite-source identification information for identifying the determined variable node.

As has been described with reference to FIG. 4B, rewrite-source identification information included in a rewrite rule stored in the rule storage unit 105 may indicate a rewrite-source variable node by either a relative path or an absolute path, with an XPath expression. For this reason, the judgment unit 115 expresses the variable node, which is determined by the search unit 110, by both a relative path and an absolute path, by use of the search tree corresponding to a graph for components to be designed. Then, the judgment unit 115 reads, from the rule storage unit 105, a rewrite rule whose rewrite-source identification information on the left-hand side matches the variable node.

Note that, in the embodiment, the rule application unit 120 to be described later gives, to a rewrite rule once used, a used mark including identification information of the variable node to which the rule is applied, as will be described in detail later. Accordingly, the judgment unit 115 preferably reads, from the rule storage unit 105, at least one rewrite rule which includes rewrite-source identification information for identifying the variable node determined by the search unit 110, and to which no used mark including the identification information on the determined variable node is given.

Then, the judgment unit 115 judges whether or not the rewrite rule thus read includes an application condition which indicates a condition for applying the rewrite rule. If no application condition is included, the judgment unit 115 judges that the rewrite rule is applicable to the variable node determined by the search unit 110.

By contrast, if an application condition is included in the read rewrite rule, the judgment unit 115 judges that the read rewrite rule is applicable to the variable node determined by the search unit 110, on condition that the specified application condition is satisfied. Here, as described above, the application condition according to the embodiment includes judgment target identification information for identifying a variable node to be judged as to whether the application condition is satisfied, and a partial graph condition indicating a certain partial graph including at least one of a fixed node and a variable node.

Thus, the judgment unit 115 identifies a variable node in a graph for components to be designed, with reference to the judgment target identification information. Then, the judgment unit 115 performs matching between a partial graph with which the identified variable node is replaced and the certain partial graph indicated by the partial graph condition. It judges, if these graphs match each other, that the read rewrite rule is applicable to the variable node determined by the search unit 110. Here, the variable node to be judged as to whether the application condition is satisfied is identifiable using an XPath expression, as in the case of the identification of the rewrite-source variable node.

Figure 6:
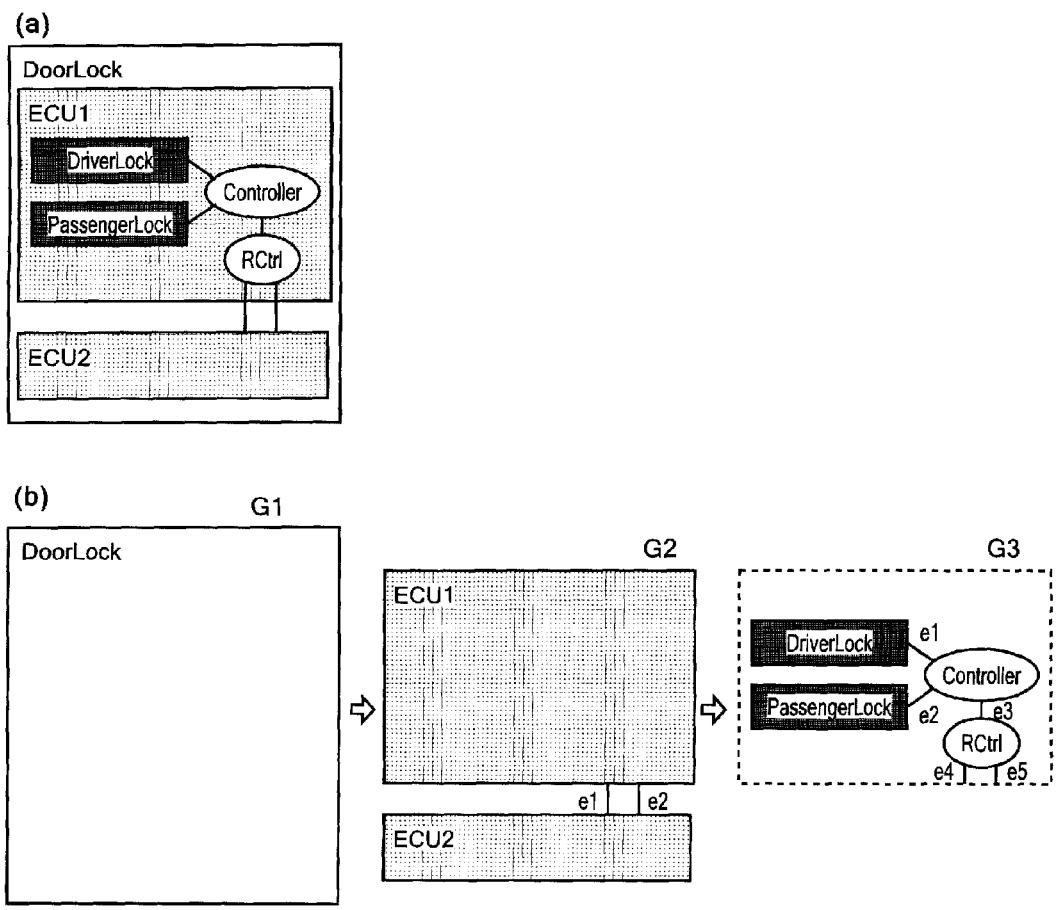
FIG. 6A shows an example of a graph in the architecture for the vehicle door locking mechanism.
FIG. 6B shows graphs of respective layers constituting the graph shown in FIG. 6A.

The method of the graph matching by the judgment unit 115 will now be described with reference to FIGS. 6 to 9. To this end, how information on graphs for components to be designed is managed in a computer is first described with reference to FIGS. 6A to 7B. FIG. 6A shows an example of a graph in an architecture for a vehicle door locking mechanism consisting of three layers. FIG. 6B shows graphs of respective layers constituting the graph shown in FIG. 6A. As can be understood from FIG. 6B, among the graphs of the respective three layers, there are such relations such that the graph G1 may be replaced with the graph G2, and that the graph G2 may be replaced with the graph G3. In the embodiment, the information on graphs in a system design architecture which are represented by a hierarchical structure in the above-described manner is managed separately as node information and edge information, as shown in FIGS. 7A and 7B.

FIG. 7A shows an example of a node table managed in a computer as a part of the graph shown in FIG. 6A. As can be understood from FIG. 7A, registered in the node table for each node are: the name of a graph given to the layer to which the node belongs; a node name; a node type (variable/fixed); and the name of a graph with which the graph of the layer of the node can be replaced.

FIG. 7B shows an example of an edge table managed in the computer as another part of the graph shown in FIG. 6A. As can be understood from FIG. 7B, registered in the edge table for each edge are: the name of a graph given to the layer to which the edge belongs; an edge name; the name of a node at an end of the edge; and the name of a node at a different end of the edge. Here, parentheses enclosing edge names e4 and e5 indicate that the edge name is an ID used for identifying the edge in the layer to which the edge belongs. The same holds for parentheses enclosing the different end node names for the respective edge names e4 and e5.

Figure 8:
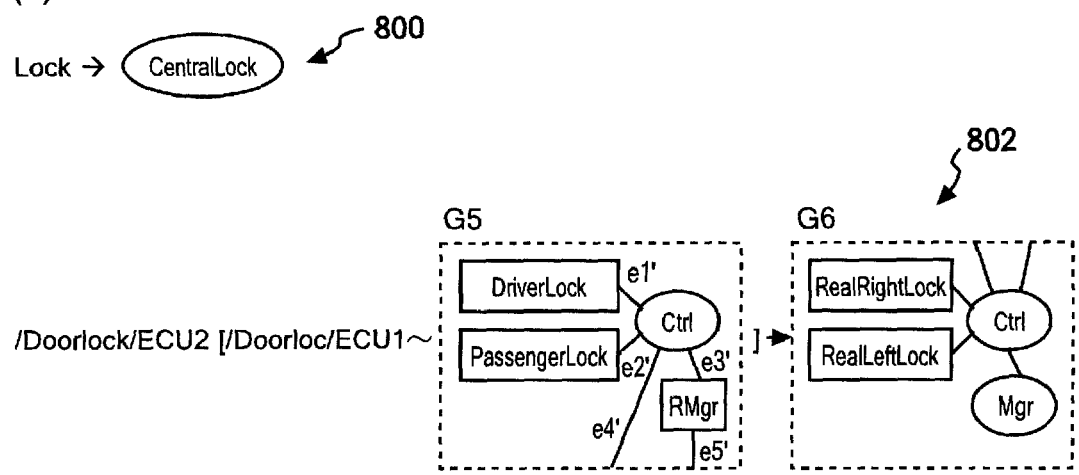
FIG. 8A shows an example of a rewrite rule.
FIG. 8B shows an example of a rule management table for managing rewrite rules held in the computer.
Figure 11:
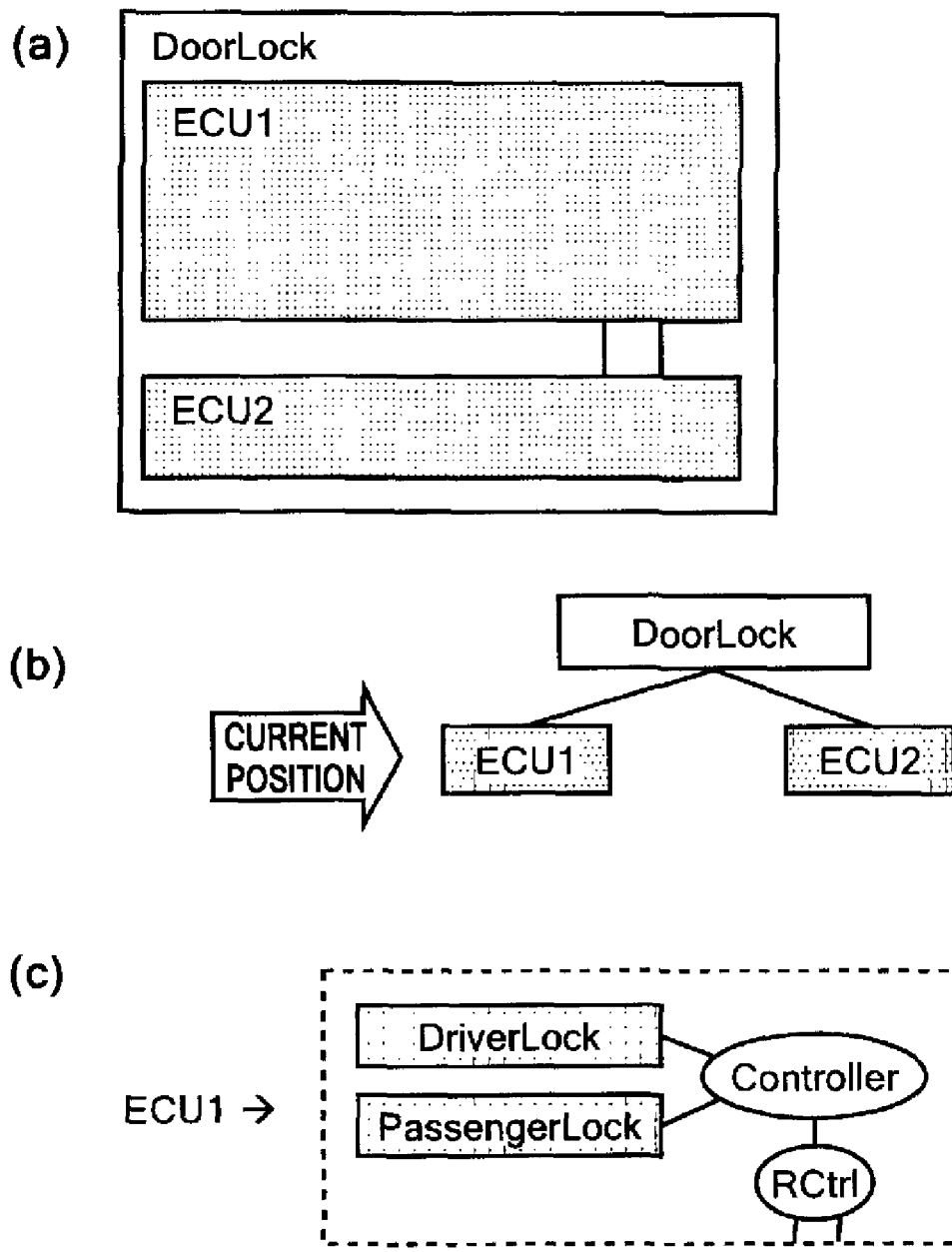
FIG. 11A shows a graph obtained by applying the rewrite rule shown in FIG. 10C to the graph shown in FIG. 10A.
FIG. 11B shows an example of a search tree corresponding to the graph shown in FIG. 11A.
FIG. 11C shows a rewrite rule applicable to a variable node indicated by a current position arrow shown in FIG. 11B.
Figure 12:
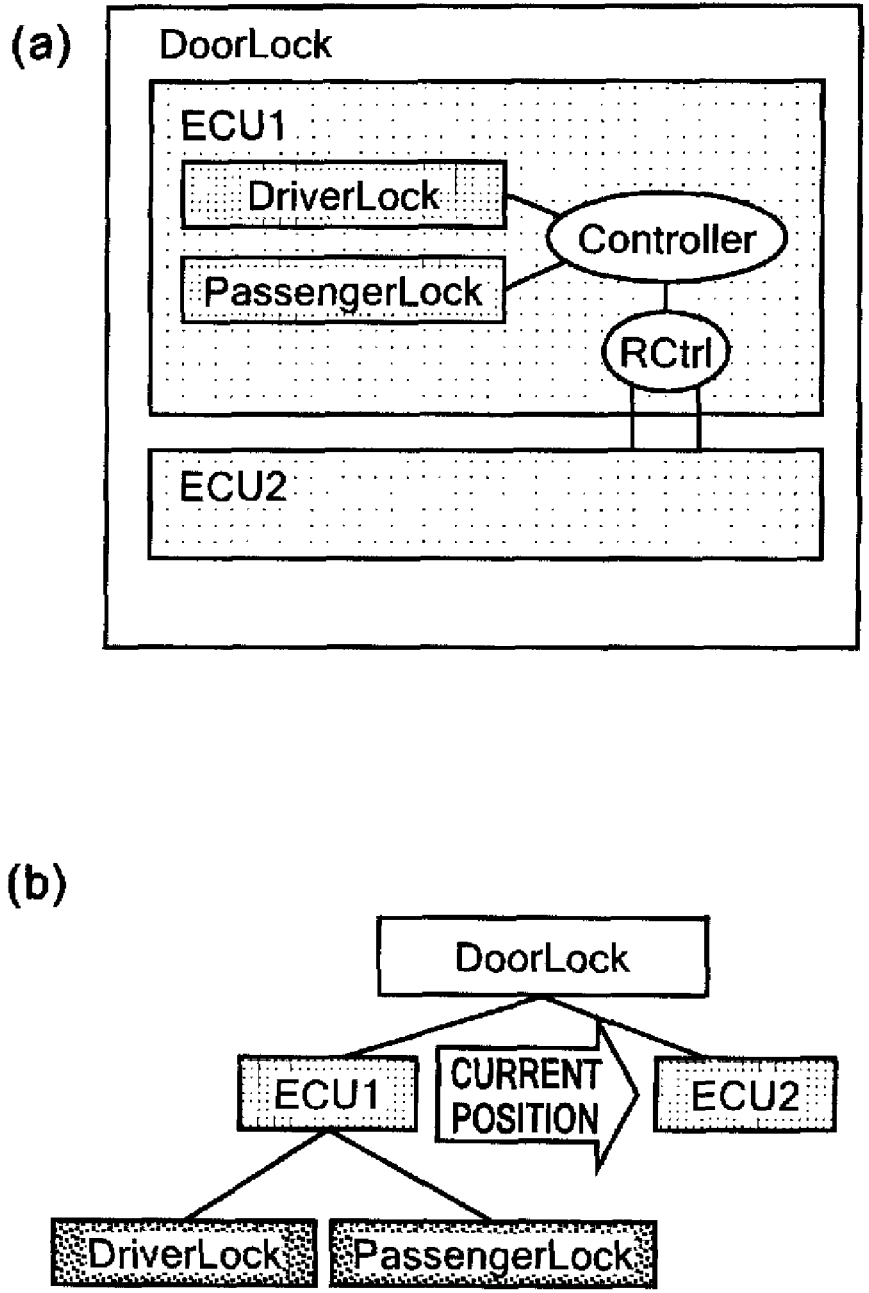
FIG. 12A shows an example of a graph obtained by applying the rewrite rule shown in FIG. 11C to the graph shown in FIG. 11A.
FIG. 12B shows an example of a search tree corresponding to the graph shown in FIG. 12A.
Figure 13:
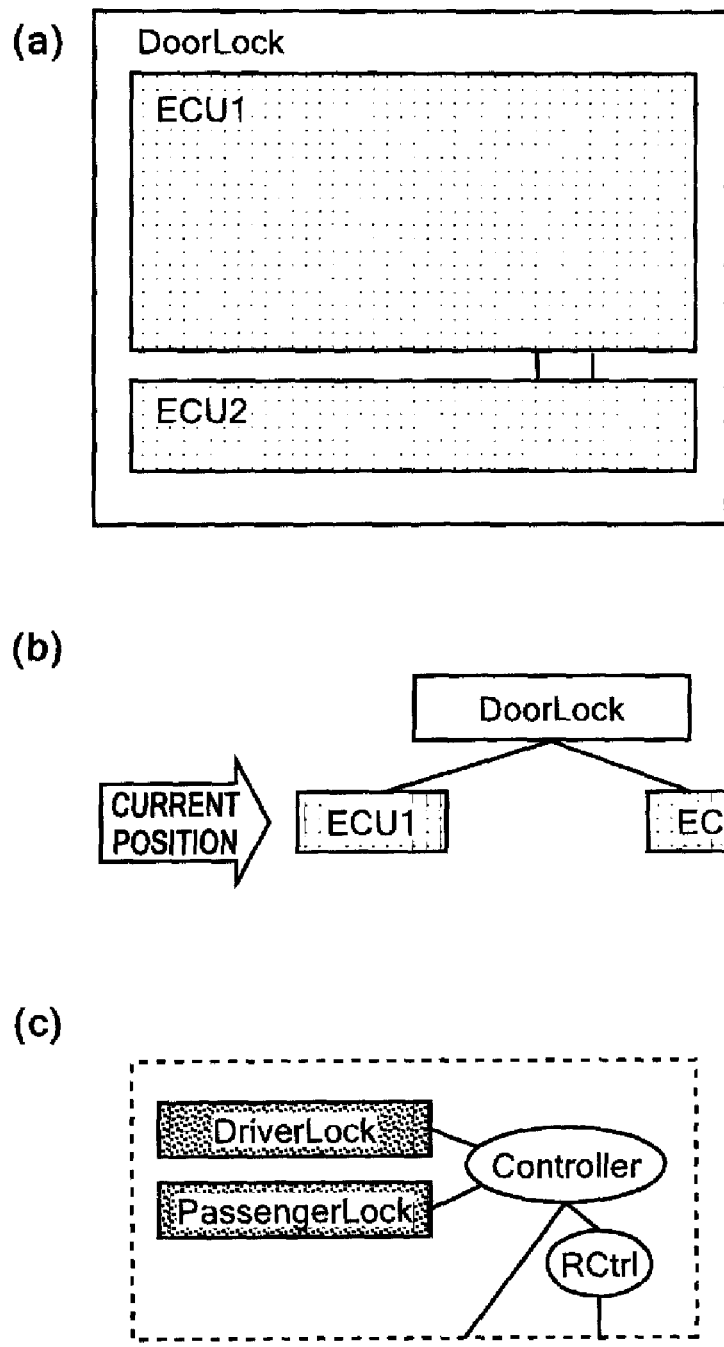
FIG. 13A shows an example of a graph obtained by backtracking from the state of the graph shown in FIG. 12A.
FIG. 13B shows an example of a search tree corresponding to the graph shown in FIG. 13A.
FIG. 13C shows a rewrite rule applicable to a variable node indicated by a current position arrow shown in FIG. 13B.
Figure 14:
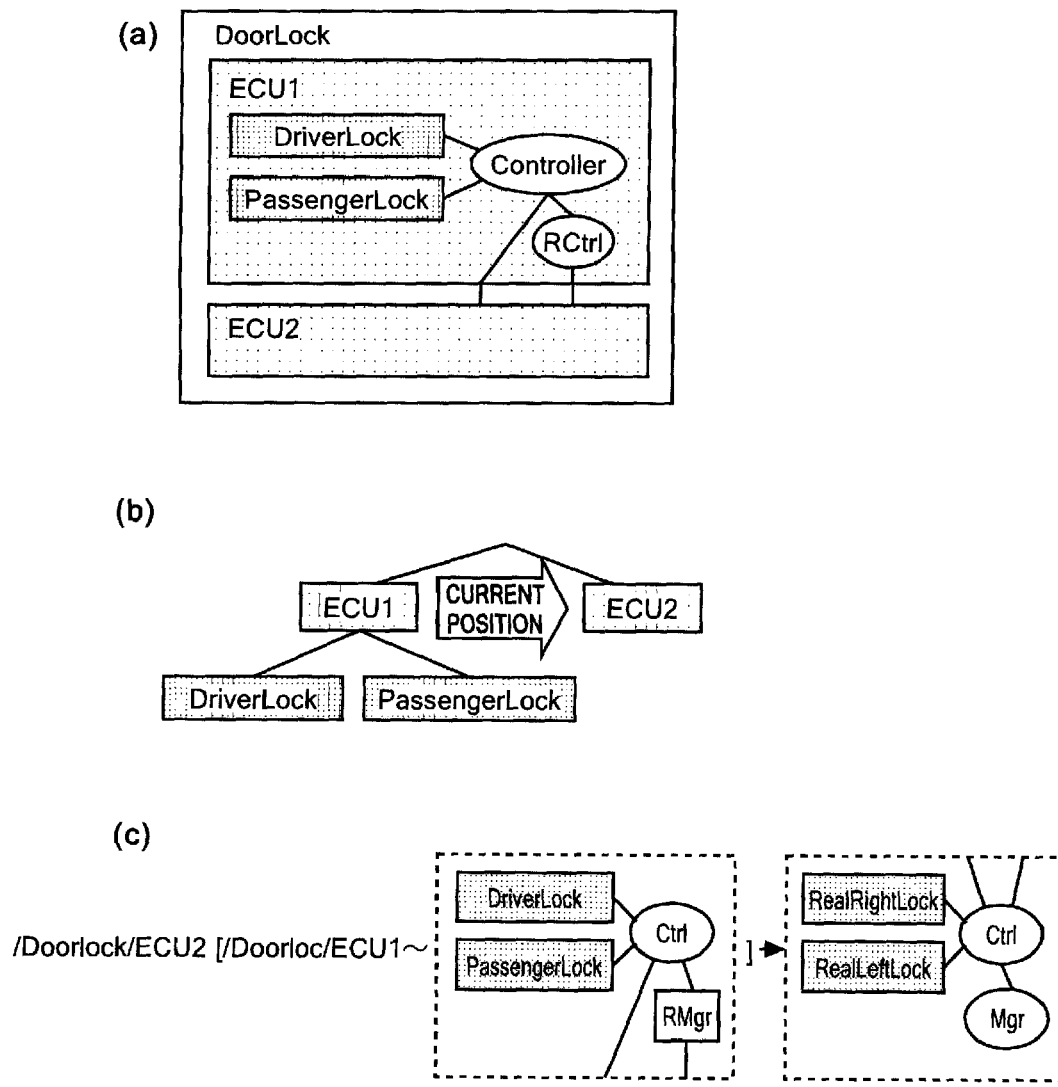
FIG. 14A shows a graph obtained by applying the rewrite rule shown in FIG. 13C to the graph shown in FIG. 13A.
FIG. 14B shows an example of a search tree corresponding to the graph shown in FIG. 14A.
FIG. 14C shows a rewrite rule applicable to a variable node indicated by a current position arrow shown in FIG. 14B.
Figure 15:
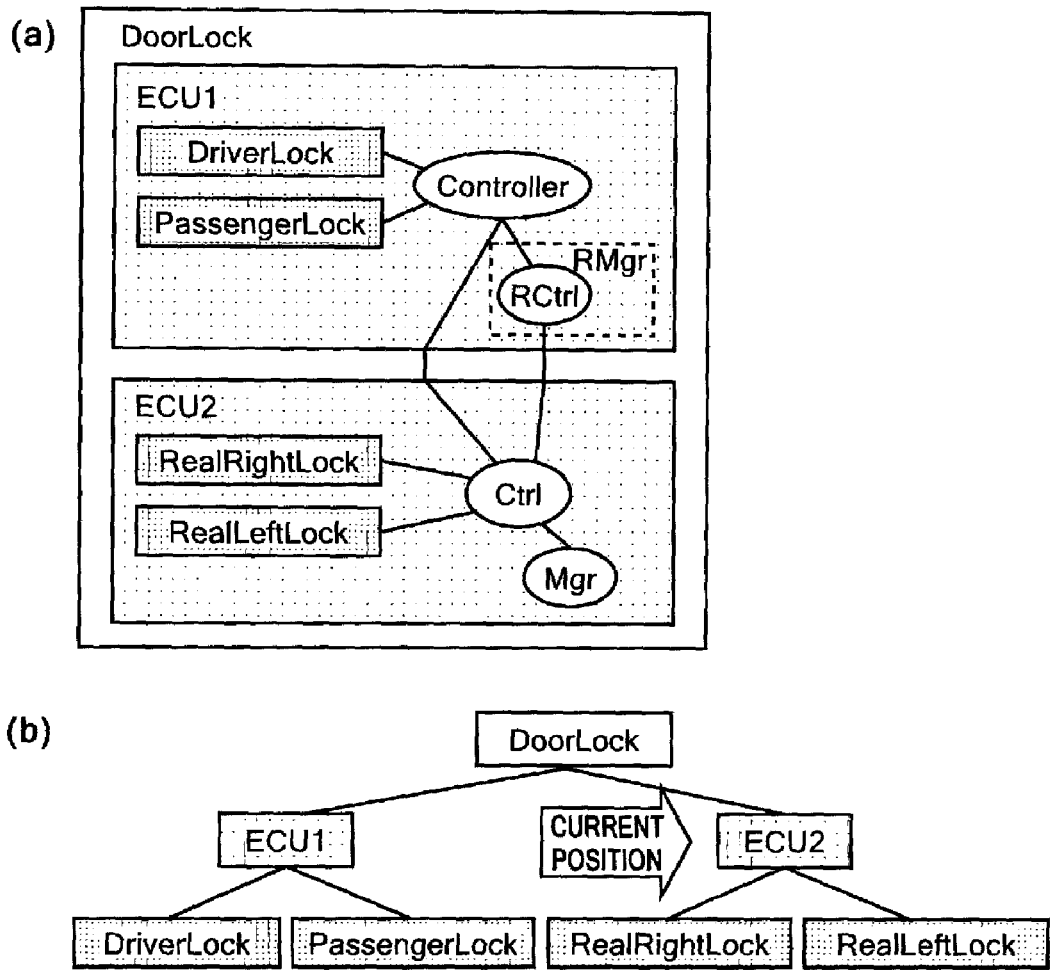
FIG. 15A shows a graph obtained by applying the rewrite rule shown in FIG. 14C to the graph shown in FIG. 14A.
FIG. 15B shows an example of a search tree corresponding to the graph shown in FIG. 15A.

Next, a description will be given of how rewrite rules are managed in a computer, with reference to FIGS. 8 and 9. FIG. 8A shows examples of a rewrite rule 800 without an application condition and a rewrite rule 802 with an application condition. FIG. 8B shows an example of a rewrite rule table in which the rewrite rules shown in FIG. 8A are registered. In the embodiment, rewrite rules are managed by using a table. Registered in the table are: a rule ID allocated to each rewrite rule; and the rewrite rule expressed with a character string.

Note that graphs to be used in pattern matching for judgment on application condition satisfaction are managed in the same way as that described with reference to FIGS. 6A to 7B. When a rewrite rule with an application condition is registered in the rewrite rule table, a graph part thereof is replaced with a graph name. For example, information on a graph G5 included in the application condition of the rewrite rule 802 with the application condition is managed by the node table shown in FIG. 9A and the edge table shown in FIG. 9B, and a graph name "G5" is registered in the rewrite rule table. When a rewrite rule is actually used, graph information corresponding to the rewrite rule is read from the node table and the edge table, with a graph name as a key. Here, as information to be registered in the rewrite rule table, a result obtained by parsing the character string may be registered instead of the character string per se.

The method of the graph matching by the judgment unit 115 will now be described in detail with reference to FIGS. 6A to 9B again. Assume a case where a graph for components to be designed is currently in the state shown in FIG. 6A, and where the search unit 110 determines that a variable node to which a rewrite rule should be applied next is the variable node ECU2 under DoorLock. The judgment unit 115 reads, from the rule storage unit 105, the rewrite rule 802 in FIG. 8A for the variable node ECU2. Then, the judgment unit 115 judges whether an application condition "/Doorlock/ECU1~<G5>" is satisfied, in order to judge the applicability of the rewrite rule 802.

Specifically, the judgment unit 115 searches the node table in FIG. 7A for an entry whose node name is Doorlock, with reference to judgment target identification information /Doorlock/ECU1 included in the application condition, and thereby acquires the graph name G2 with which Doorlock is replaced. Subsequently, the judgment unit 115 searches the node table for an entry whose graph name is G2 and whose node name is ECU1, and thereby acquires the graph name G3 with which ECU1 is replaced. Lastly, the judgment unit 115 performs graph matching between the graph G3 and the graph G5.

The graph matching is performed in such a manner that corresponding nodes of the respective graphs G3 and G5 and corresponding edges thereof are sequentially compared with each other with reference to the node tables (FIG. 7A and FIG. 9A) of the respective graphs G3 and G5 and the edge tables (FIG. 7B and FIG. 9B) thereof. Preferably, in the graph matching, matching between fixed nodes is first performed and matching between variable nodes is performed thereafter, whereby the calculation time is reduced. Moreover, in the graph matching, the judgment unit 115 can judge that graphs match not only when the graphs are identical with each other but also when a certain graph included in the application condition includes a graph with which the variable node, to be judged and located in the graph for components to be designed, is replaced. In the case of the graph matching between the graph G3 and the graph G5, it is finally judged that these two graphs do not match because of the mismatch between an edge e4 of the graph G3 and an edge e4' of the graph G5.

In response to the judgment result by the judgment unit 115 that the read rewrite rule is applicable, the rule application unit 120 replaces the variable node determined by the search unit 110 with a partial graph including at least one of a fixed node and a variable node, in accordance with the rewrite rule. To be more specific, the rule application unit 120 replaces, in accordance with partial graph information included in the read rewrite rule, the variable node determined by the search unit 110 with the partial graph indicated by the partial graph information.

When applying a rewrite rule to a variable node, the rule application unit 120 gives the rewrite rule thus used a used mark including identification information of the variable node to which the rewrite rule is applied. In response to the rewrite of the determined variable node, the rule application unit 120 also updates the corresponding search tree. Specifically, in the corresponding search tree, the rule application unit 120 adds, as a child node, a variable node included in the partial graph with which the variable node determined by the search unit 110 is replaced, under the determined variable node.

The derived data storage unit 125 stores a graph for components to be designed at the time when the search unit 110 judges that an undefined variable node no longer exists in the graph for components to be designed. Here, information on the graph stored in the derived data storage unit 125 consists of information stored in the node table and information stored in the edge table, as has been described with reference to FIGS. 7A and 7B.

Figure 17:
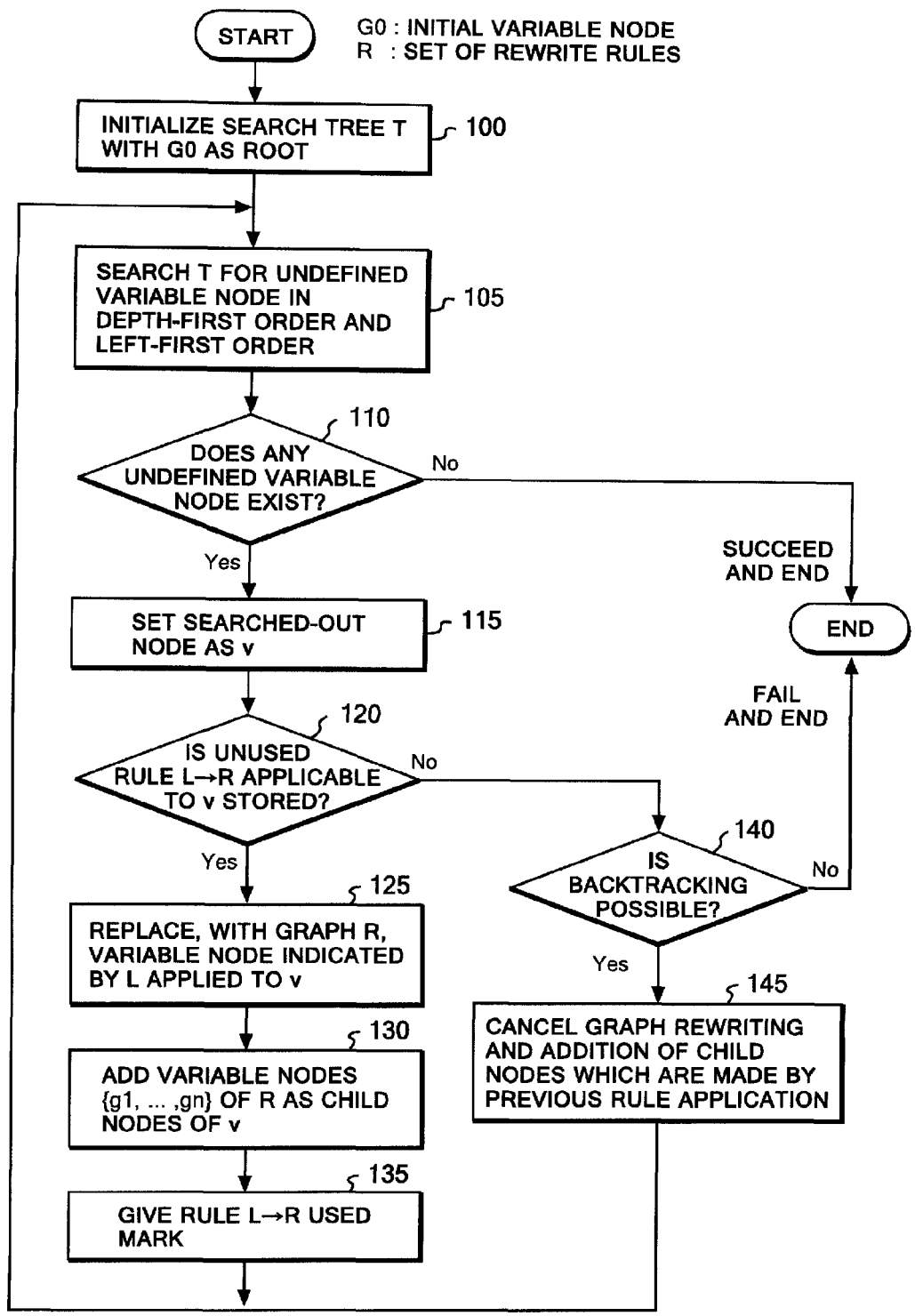
FIG. 17 is a flowchart showing an example of a flow of processes for automatically designing an architecture according to the embodiment.

Next, a description will be given of an example of a flow of automatic designing processes shown in FIG. 17 and performed by the automatic designing system 100 according to the embodiment of the present invention, with reference to FIGS. 11A to 16B. In FIG. 17, the process starts from Step 100. In this step, the search unit 110 receives a graph for components to be designed including one variable node G0, and initializes a search tree T, which corresponds to the graph for components to be designed, with the variable node G0 as the root node. Note that, if the graph for components to be designed includes multiple variable nodes or multiple nodes including a variable node and a fixed node, the search unit 110 initializes the corresponding search tree T to have a tree structure representing the hierarchical structure of the graph for components to be designed and to include only variable nodes. In Step 100, the search unit 110 also initializes a search position P of the search tree to point to the root node.

Subsequently, the search unit 110 searches the search tree T in a depth-first order and in a left-first order in order to determine an undefined variable node, to which a rewrite rule should be applied next, in the graph for components to be designed (Step 105). Thereby, the search unit 110 judges whether or not any undefined variable node exists (Step 110). If no undefined variable node exists (Step 110: No), the process succeeds and terminates. In a case where the judgment in Step 110 is performed for the first time, an undefined variable node is surely found and thus the judgment result in Step 110 is YES. In this case, the search unit 110 sets the undefined variable node thus searched out as v, and passes information on the variable node v to the judgment unit 115 (Step 115).

The judgment unit 115 having received the information on the variable node v judges whether or not a rewrite rule applicable to the variable node v is stored in the rule storage unit 105 (Step 120). If any applicable rewrite rule is found (Step 120: YES), the judgment unit 115 passes information on the applicable rewrite rule to the rule application unit 120.

The rule application unit 120 having received the information on the rewrite rule replaces, with a partial graph indicated by partial graph information included in the received rewrite rule, the variable node v thus searched out from the graph for components to be designed, i.e., the variable node v identified with rewrite-source identification information included in the received rewrite rule (Step 125).

Subsequently, the rule application unit 120 adds all variable nodes which are included in the partial graph indicated by the partial graph information, under the node to which the current search position P of the corresponding search tree T points (Step 130). The rule application unit 120 also gives the applied rewrite rule a used mark including identification information of the variable node v to which the rewrite rule is applied (Step 135). Thereafter, the process returns to Step 105 and repeats the series of steps described above.

The processes from Step 100 to Step 135 will now be described with reference to FIGS. 10A to 12B. Assume a case where the rule storage unit 105 stores the rewrite rules shown in FIGS. 5A to 5D, and where the search unit 110 first receives the graph shown in FIG. 10A as a graph for components to be designed in Step 100. In this case, the search tree T corresponding to the graph is initialized with the variable node Doorlock as its root node, as shown in FIG. 10B. Here, the initial value of the current search position P is set at the root node, as shown in FIG. 10B.

Subsequently, the search unit 110 searches the search tree T in a depth-first order and in a left-first order, and determines the variable node Doorlock, which is the root node, as the undefined variable node v, through the process from Step 105 to Step 115. In Step 120, the judgment unit 115 reads, from the rule storage unit 105, a rewrite rule 500 (see FIG. 5A and FIG. 10C) that includes rewrite-source identification information for identifying the variable node Doorlock, which is the root node, as a rewrite rule applicable to the variable node Doorlock.

In Step 125, the rule application unit 120 receives the rewrite rule 500, applies the rewrite rule 500 to Doorlock in the graph (see FIG. 10A) which the current search position P points to and corresponds to the root node Doorlock, and thus obtains a new graph for components to be designed (see FIG. 11A). In Step 130, the rule application unit 120 adds the two variable nodes ECU1 and ECU2 included in the rewrite rule 500 (see FIG. 10C) under the root node Doorlock to which the current search position P points (see FIG. 10B), and thereby updates the search tree T (see FIG. 11B). In this event, the rule application unit 120 gives the rewrite rule 500 a used mark including identification information of the variable node Doorlock to which the rule is applied.

Then, the process returns to Step 105, and repeats the steps similar to those described above. To be more specific, by using the updated search tree T (see FIG. 11B), the search unit 110 searches for the undefined variable node v to which a rewrite rule should be applied next, in a depth-first order and in a left-first order. Thus, the search unit 110 determines ECU1 under Doorlock as the undefined variable node v to which a rewrite rule should be applied next, as shown in FIG. 11B. In this event, the search unit 110 updates the current search position P with ECU1 under Doorlock.

Subsequently, the judgment unit 115 reads, from the rule storage unit 105, a rewrite rule 502 (see FIG. 5B and FIG. 11C) that includes rewrite-source identification information for identifying the variable node ECU1, as an applicable rewrite rule. Note that, although a rewrite rule 504 is also provided in addition to the rewrite rule 502 as a rewrite rule applicable to the undefined variable node ECU1, the rewrite rule 502 is assumed to be read first here. Thereafter, the rule application unit 120 applies the rewrite rule 502 (see FIG. 11C) to ECU1 under Doorlock (see FIG. 11B), to which the current search position P points, and thus newly obtains a graph shown in FIG. 12A and a search tree shown in FIG. 12B. Here, the rewrite rule 502 is given a used mark including identification information of the variable node ECU1 under Doorlock, to which the rule is applied.

Next, with reference to the flowchart in FIG. 17 again, a description will be given of a case where, in Step 120, the judgment unit 115 having received the information of the variable node v judges that no rewrite rule applicable to the variable node v is stored in the rule storage unit 105 (Step 120: No). In this case, the judgment unit 115 returns the process back to the search unit 110. The search unit 110 to which the process has been returned judges whether or not backtracking is possible (Step 140).

The term "backtracking" means cancelling the graph that was previously rewritten. This restores the graph to the previous state. Accordingly, the search unit 110 judges whether or not any graph rewriting to be cancelled exists. If no graph rewriting to be cancelled exists, the search unit 110 judges that backtracking is not possible (Step 140: NO), and thus the process fails and terminates. In contrast, if any graph rewriting to be cancelled exists, the search unit 110 cancels the graph rewriting and the update of the search tree, i.e., the addition of child nodes, which are made by the previous rewrite rule application (Step 145). Then, the process returns to Step 105 and repeats the series of steps described above.

The process from Step 120 to Step 145 will now be described with reference to FIGS. 12A and 13C. Assume a case where a current graph for components to be designed and a search tree corresponding to the graph are in the states as shown in FIGS. 12A and 12B, respectively, and where the current search position P is updated with ECU2 under Doorlock as a result of the search by the search unit 110. The search unit 110 passes the process to the judgment unit 115. Then, the judgment unit 115 reads, from the rule storage unit 105, a rewrite rule 506 (see FIG. 5B) that includes rewrite-source identification information for identifying ECU2 under Doorlock, as a rewrite rule applicable to ECU2 under Doorlock.

Since the rewrite rule 506 thus read is a rewrite rule with an application condition, the judgment unit 115 subsequently judges whether or not the current graph for components to be designed shown in FIG. 12A satisfies the application condition which is written in the predicate of the rewrite rule 506. Specifically, the judgment unit 115 identifies the variable node ECU1 in the graph for components to be designed, with reference to judgment target identification information included in the application condition of the rewrite rule 506. Then, the judgment unit 115 performs graph matching between a partial graph with which the identified variable node ECU1 is replaced and a certain partial graph, indicated by a partial graph condition, and judges whether or not these graphs match each other. The concrete way of the graph matching is the same as that described with reference to FIGS. 6A to 9B, and thus a repeated description will be omitted here.

As has been described, the graph matching in this case fails. Accordingly, the judgment unit 115 returns the process back to the search unit 110 and the search unit 110 judges whether or not backtracking is possible. At this point, the graph for components to be designed is the graph shown in FIG. 12A. As described above, in a computer, information on the graph shown in FIG. 12A is held in the node table shown in FIG. 7A and the edge table shown in FIG. 7B. Thus, the search unit 110 refers to the column "replaceable graph name" in the node table shown in FIG. 7A, and finds out that the graph G3 is the one obtained by the last replacement.

Since there is rewriting to be cancelled, the search unit 110 judges that backtracking is possible, and cancels the replacement with the graph G3. To be more specific, the search unit 110 deletes the entries whose "graph name" is "G3," and alters, to "undefined," "G3" in the column "replaceable graph name" of the entries whose "graph name" is "G2," in the node table shown in FIG. 7A. Further, the search unit 110 deletes the two child nodes of ECU1 to which the current search position P has previously pointed, in the search tree shown in FIG. 12B. FIG. 13A shows a current graph for components to be designed obtained by backtracking, and FIG. 13B shows a search tree corresponding to the graph shown in FIG. 13A. Here, the current search position P goes back to its previous position and is updated with ECU1 under Doorlock. Then, the series of steps described above is repeated again.

The graph for components shown in FIG. 13A is identical with the graph for components shown in FIG. 11A. However, since the rewrite rule 502 shown in FIG. 5B has been already used, the rewrite rule 502 is given a used mark including identification information of the variable node ECU1 under Doorlock, in the process after the backtracking. For this reason, the rewrite rule 504 (see FIG. 5B and FIG. 13C) not having been used is read from the rule storage unit 105 as an applicable rewrite rule for the undefined variable node ECU1 in the graph shown in FIG. 13A. Then, a graph for components shown in FIG. 14A and an updated search tree shown in FIG. 14B are obtained as a result of the application of the rewrite rule 504. Thereafter, the judgment unit 115 again reads the rewrite rule 506 (see FIG. 5B and FIG. 14C) for the undefined variable node ECU2 in the graph shown in FIG. 14A, and judges whether or not the application condition included in the rewrite rule 506 is satisfied.

In the graph shown in FIG. 14A, a graph with which ECU1 is replaced matches a certain graph included in the application condition of the rewrite rule 506 (see FIG. 14C). Hence, the rewrite rule 506 (see FIG. 14C) is applied to the undefined variable node ECU2 in the graph shown in FIG. 14A. As a result of the application of the rewrite rule 506, a graph for components shown in FIG. 15A and an updated search tree shown in FIG. 15B are obtained.

In a state where the current graph for components is as shown in FIG. 15A, rewrite rules shown in FIGS. 5C and 5D, i.e., rewrite rules 508, 510, 512, 514, 516, 516, 516 and 516 are applied in this order. Consequently, a graph for components shown in FIG. 16A is obtained. FIG. 16B shows a search tree corresponding to the graph shown in FIG. 16A. In this way, in the present invention, existing architectures are efficiently reused as rewrite rules to obtain a derived architecture. Note that, the resultant architecture for which all variable nodes are defined is stored in the derived data storage unit 125 by the search unit 110.

Figure 18:
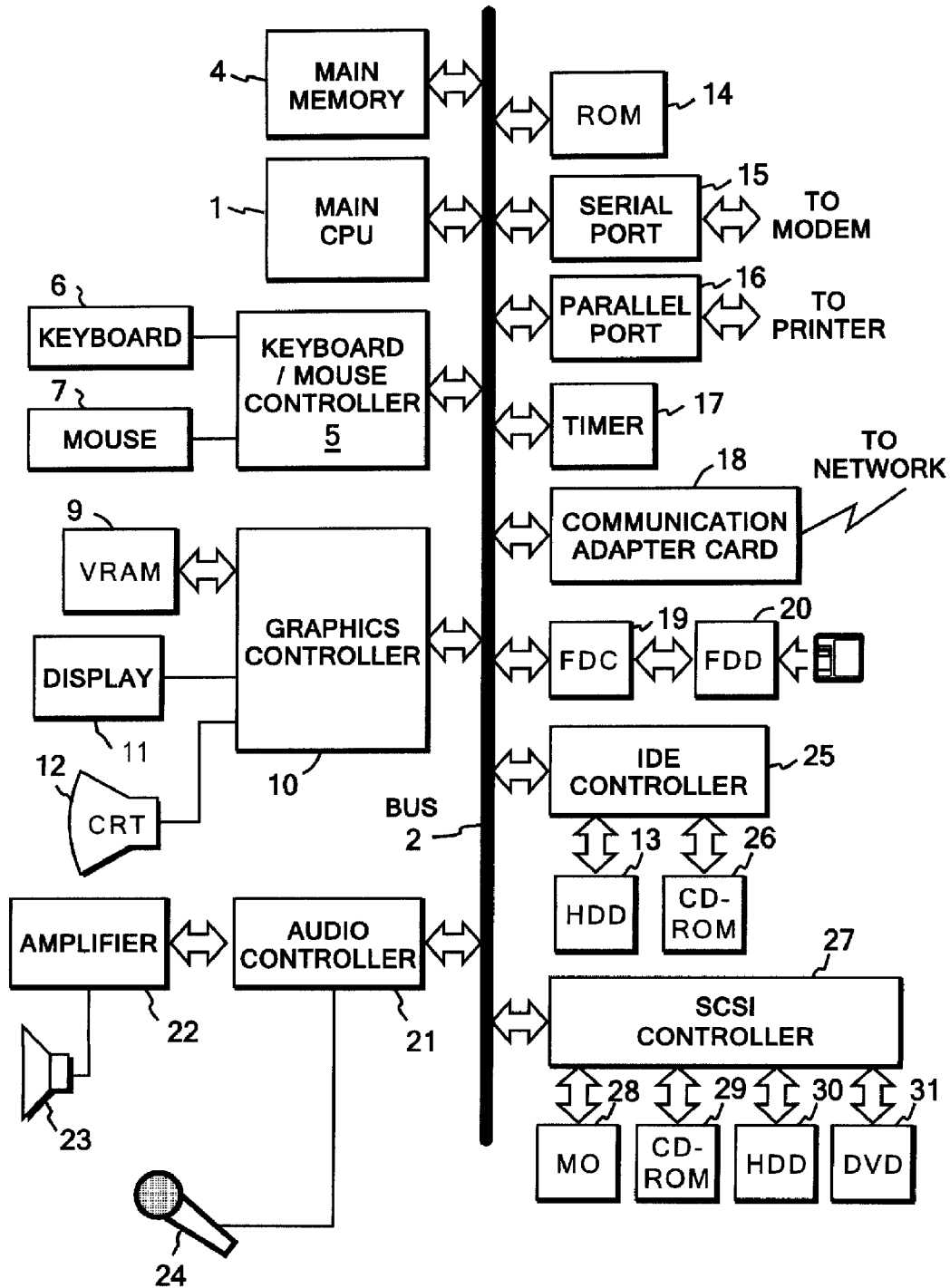
FIG. 18 shows an example of a hardware configuration of a computer 50 according to the embodiment.

FIG. 18 is a diagram showing an example of a hardware configuration of a computer suitable for implementing the automatic designing system 100 according to the embodiment of the present invention. The computer includes a main central processing unit (CPU) 1 and a main memory 4 connected to a bus 2. Removable storages (external storage systems each using an exchangeable recording medium) such as hard disk drives 13 and 30, CD-ROM drives 26 and 29, a flexible disk drive 20, an MO drive 28 and a DVD drive 31 are connected to the bus 2 through a flexible disk controller 19, an IDE controller 25, a SCSI controller 27 and the like.

A storage medium such as a flexible disk, an MO, a CD-ROM or a DVD-ROM is inserted into the corresponding removable storage. It is possible to store, in these storage media, the hard disk drives 13 and 30 as well as a ROM 14, the code of a computer program for implementing the present invention by giving a command to the CPU and the like, in cooperation with an operating system. Specifically, above-described rewrite rules, graph information of partial graphs included in application conditions of the rewrite rules, data on derived design architecture and the like obtained by computer processing, and automatic designing programs can be stored in the above-described storage devices of the computer as the automatic designing system 100. These multiple computer programs are loaded into the main memory 4 to be executed. It is also possible to compress the computer program, or divide the computer program into some pieces so that the resultant computer programs may be recorded in multiple media.

The computer receives inputs from input devices such as a keyboard 6 and a mouse 7 through a keyboard/mouse controller 5. Moreover, the computer receives an input from a microphone 24 through an audio controller 21, and then outputs sound from a speaker 23. The computer is connected to a display device 11 for providing visual data to a user, through a graphics controller 10. Furthermore, the computer is connected to a network through a network adaptor 18 (such as an Ethernet® card or a token ring card) or the like, and can thereby communicate with other computers and the like.

From the above description, it may be easily understood that the computer suitable for implementing the automatic designing system 100 according to the embodiment of the present invention can be achieved by an information processor such as a standard personal computer, a work station or a main frame, or a combination of these. It should be noted that the above-described constituent elements are given as examples, and that not all the constituent elements are essential for the present invention.

Hereinabove, the present invention has been described on the basis of the embodiment. However, the technical scope of the present invention is not limited to the scope of the above-described embodiment. It is obvious to those skilled in the art that various modifications or improvements can be made to the above-described embodiment. Hence, such modified or improved embodiments are also naturally included in the technical scope of the present invention.

According to the present invention, while a rewritable part is taken as a variable node and a non-rewritable part is taken as a fixed node in a previously-designed design architecture for a system, patterns of the previously-designed design architecture for the system are written as rewrite rules, and the process of generating a derived design architecture is treated as a graph rewriting process. This allows automatically deriving an architecture by means of computation by a computer.

Moreover, the present invention applies rewrite rules to a graph for components to be designed, in the order according to a tree structure of the graph. This makes it possible to limit the space to be searched, and thus to determine the order in which rewrite rules are applied to a graph, with a practical amount of calculation. As a result, the total time complexity is significantly reduced. Further, since rewrite rules are applied to a graph for components to be designed in the order according to a tree structure of the graph, a description of rewrite rules can be simplified. Other effects of the present invention can be understood by referring to the description of the embodiment.

Although the preferred embodiment of the present invention has been described in detail, it should be understood that various changes, substitutions and alternations can be made therein without departing from spirit and scope of the invention as defined by the appended claims.

What is claimed is:

1. An automatic designing system for automatically designing an architecture for components in a system, the automatic designing system comprising:
a rule storage unit which stores a set of rewrite rules each used for rewriting a variable node of a hierarchically structured graph in a design architecture for the system, a rewritable part of the rewrite rules being taken as a variable node and a non-rewritable part being taken as a fixed node in a previously-designed design architecture for the system;
a search unit (i) which sequentially determines variable nodes to be application targets for the rewrite rules by repeatedly searching the graph including components in the design architecture for the system to be designed using a search tree for the graph until an undefined variable node no longer exists in the graph and (ii) which performs backtracking on condition that no variable node to be the application target is found;
a judgment unit which reads one of the rewrite rules corresponding to the determined variable node from the rule storage unit and judges whether or not the rewrite rule is applicable to the determined variable node; and
a rule application unit which replaces the determined variable node with a partial graph in accordance with the read rewrite rule in response to a judgment result that the read rewrite rule is applicable, the partial graph including at least one of the fixed node and the variable node.

2. The automatic designing system according to claim 1, wherein the search unit is configured to search the graph, including the components to be designed, by using the search tree in a depth-first order and in a left-first order for nodes at the same depth.

3. The automatic designing system according to claim 1, wherein:
each of the rewrite rules stored in the rule storage unit includes rewrite-source identification information for identifying a rewrite-source variable node; and
the judgment unit is configured to read, from the rule storage unit, at least one of the rewrite rules which includes the rewrite-source identification information for identifying the determined variable node.

4. The automatic designing system according to claim 3, wherein:
the rewrite-source identification information included in each of the rewrite rules is configured to use Xpath to indicate the rewrite-source variable node; and the judgment unit is configured to read, from the rule storage unit, at least one of the rewrite rules which includes the rewrite-source identification information for indicating a node located in the corresponding search tree and corresponding to the determined variable node.

5. The automatic designing system according to claim 1, wherein:
   each of the rewrite rules stored in the rule storage unit includes rewrite-source identification information for identifying a rewrite-source variable node;
   the rule application unit gives a used mark, including identification information of a variable node to which the rewrite rule is applied, to each rewrite rule once used; and
   the judgment unit reads, from the rule storage unit, at least one of the rewrite rules which includes the rewrite-source identification information for identifying the determined variable node, and which is given no used mark including the identification information of the determined variable node.

6. The automatic designing system according to claim 1, wherein:
   each of the rewrite rules stored in the rule storage unit further includes partial graph information indicating the partial graph with which the variable node being a rewrite source should be replaced and which includes at least one of the fixed node and the variable node; and
   the rule application unit rewrites the determined variable node in accordance with the partial graph information.

7. The automatic designing system according to claim 1, wherein:
   each of the rewrite rules stored in the rule storage unit includes an application condition indicating a condition for applying the rewrite rule; and
   the judgment unit judges that the read rewrite rule is applicable on condition that the application condition is satisfied.

8. The automatic designing system according to claim 7, wherein:
   the application condition included in each of the rewrite rules includes judgment target identification information for identifying a variable node to be judged as to whether the applied condition is satisfied and a partial graph condition indicating a certain partial graph including at least one of the fixed node and the variable node;
   the judgment unit identifies the variable node in the graph for the components to be designed with reference to the judgment target identification information; and
   the judgment unit judges that the read rewrite rule is applicable on condition that (i) the partial graph with which the identified variable node is replaced and (ii) the certain partial graph indicated by the partial graph condition match each other.

9. The automatic designing system according to claim 1, wherein the search tree has, as its nodes, all variable nodes included in the graph for the components to be designed, and has a tree structure corresponding to the hierarchical structure of the graph for the components to be designed.

10. The automatic designing system according to claim 1, wherein the rule application unit updates the search tree in response to the replacement of the determined variable node.

11. A computer-implemented automatic designing method for automatically designing an architecture for components in a system by means of computation by a computer capable of accessing a storage unit which stores a set of rewrite rules each used for rewriting a variable node of a hierarchically structured graph in a design architecture for the system, the rewrite rules being written while a rewritable part is taken as a variable node and a non-rewritable part is taken as a fixed node in a previously-designed design architecture for the system, the automatic designing method comprising the steps of:
   (a) storing, in a work area, a graph for components in the design architecture for the system to be designed;
   (b) searching the graph, including the components to be designed, by means of computation by the computer using a search tree corresponding to the graph, thereby determining that a variable node is an application target for any of the rewrite rules and then storing, as a current search position, a position of a node in the search tree corresponding to the determined variable node;
   (c) reading one of the rewrite rules from the storage unit, and judging, by means of computation by the computer, whether or not the read rewrite rule is applicable to the determined variable node;
   (d) in response to a judgment result that the read rewrite rule is applicable, replacing the determined variable node with a partial graph, which includes at least one of the fixed node and the variable node, in accordance with the read rewrite rule by means of computation by the computer, and storing, in the work area, the resultant graph for the components to be designed;
   (e) repeating the steps (b) through (d) while updating the current search position until an undefined variable node no longer exists in the graph for the components to be designed; and
   (f) backtracking if no variable node is determined to be the application target in the searching step, thereby moving the current search position back to the previous one;
   wherein each of the foregoing steps is performed by a data processing machine.

12. A storage medium tangibly storing an automatic design computer program for automatically designing an architecture for components in a system, the automatic designing program, when it is executed by a computer capable of accessing a storage unit which stores a set of rewrite rules each used for rewriting a variable node of a hierarchically structured graph in a design architecture for the system, the rewrite rules being written while a rewritable part is taken as a variable node and a non-rewritable part is taken as a fixed node in a previously-designed design architecture for the system, which program causes the computer to execute the steps of:
   (a) storing, in a work area, a graph for components in the design architecture for the system to be designed;
   (b) searching the graph including the components to be designed, by means of computation by the computer using a search tree corresponding to the graph, thereby determining a variable node to be an application target for any of the rewrite rules, and then storing, as a current search position, a position of a node in the search tree corresponding to the determined variable node;
   (c) reading a corresponding one of the rewrite rules from the storage unit, and judging, by means of computation by the computer, whether or not the read rewrite rule is applicable to the determined variable node;
   (d) in response to a judgment result that the read rewrite rule is applicable, replacing the determined variable node with a partial graph, which includes at least one of the fixed node and the variable node, in accordance with the read rewrite rule by means of computation by the computer, and storing, in the work area, the resultant graph for the components to be designed;

(e) repeating the steps (b) through (d) while updating the current search position, until an undefined variable node no longer exists in the graph for the components to be designed; and (f) backtracking if no variable node is determined to be the application target in the searching step, thereby moving the current search position back to the previous one.

\* \* \* \* \*